United States Patent
Shimodaira et al.

(10) Patent No.: US 9,677,192 B2
(45) Date of Patent: Jun. 13, 2017

(54) GROUP 3B NITRIDE CRYSTAL SUBSTRATE (75) Inventors: Takanao Shimodaira, Nagoya (JP); Katsuhiro Imai, Nagoya (JP); Makoto Iwai, Kasugai (JP); Takayuki Hirao, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 51 days.

(21) Appl. No.: 13/135,829

(22) Filed: Jul. 15, 2011

(65) Prior Publication Data
US 2011/0274609 A1    Nov. 10, 2011

Related U.S. Application Data (63) Continuation of application No. PCT/JP2009/070827, filed on Dec. 14, 2009.

(30) Foreign Application Priority Data

Jan. 21, 2009  (JP) .................................. 2009-011264
Jan. 28, 2009  (JP) .................................. 2009-017289

(51) Int. Cl.
*C30B 9/12*   (2006.01)
*C30B 29/40*  (2006.01)

(52) U.S. Cl.
CPC .............. *C30B 9/12* (2013.01); *C30B 29/403* (2013.01); *C30B 29/406* (2013.01)

(58) Field of Classification Search
None
See application file for complete search history.

(56) References Cited

U.S. PATENT DOCUMENTS

| 6,225,195 | B1 | 5/2001 | Iyechika et al. |
| 7,777,217 | B2 * | 8/2010 | Preble ..................... C30B 25/02 257/189 |
| 2004/0003495 | A1 * | 1/2004 | Xu .......................... C30B 11/00 29/832 |
| 2005/0011432 | A1 | 1/2005 | Kitaoka et al. |
| 2006/0037529 | A1 * | 2/2006 | D'Evelyn et al. ............. 117/36 |
| 2006/0051942 | A1 | 3/2006 | Sasaki et al. |
| 2006/0102926 | A1 | 5/2006 | Kikkawa et al. |
| 2006/0228870 | A1 | 10/2006 | Oshima |
| 2007/0215033 | A1 | 9/2007 | Imaeda et al. |

(Continued)

FOREIGN PATENT DOCUMENTS

| JP | 05-152416 | 6/1993 |
| JP | 06-087688 | 3/1994 |

(Continued)

OTHER PUBLICATIONS

Japanese Office Action from a corresponding Japanese patent application bearing a mailing date of Mar. 11, 2014, 4 pages.

*Primary Examiner* — Guinever S Gregorio
(74) *Attorney, Agent, or Firm* — Burr & Brown, PLLC (57) ABSTRACT

A group 13 nitride crystal substrate according to the present invention is produced by growing a group 13 nitride crystal on a seed-crystal substrate by a flux method, wherein a content of inclusions in the group 13 nitride crystal grown in a region of the seed-crystal substrate except for a circumferential portion of the seed-crystal substrate, the region having an area fraction of 70% relative to an entire area of the seed-crystal substrate, is 10% or less, preferably 2% or less.

3 Claims, 6 Drawing Sheets
(5 of 6 Drawing Sheet(s) Filed in Color)

(56) References Cited

U.S. PATENT DOCUMENTS

2007/0215035 A1    9/2007   Kitaoka et al.
2008/0283968 A1   11/2008   Sasaki et al.

FOREIGN PATENT DOCUMENTS

| | | |
|---|---|---|
| JP | 08-310895 | 11/1996 |
| JP | 11-112030 A | 4/1999 |
| JP | 2005-039248 A | 2/2005 |
| JP | 2005-263622 A1 | 9/2005 |
| JP | 2006-147663 A | 6/2006 |
| JP | 2006-290671 A1 | 10/2006 |
| JP | 2007-119325 A1 | 5/2007 |
| JP | 2007-201145 A | 8/2007 |
| JP | 2007-217227 A1 | 8/2007 |
| JP | 2007-238343 A1 | 9/2007 |
| JP | 2007-254161 A1 | 10/2007 |
| WO | 2004/013385 A1 | 2/2004 |
| WO | 2005/111278 A1 | 11/2005 |

* cited by examiner

GROUP 3B NITRIDE CRYSTAL SUBSTRATE

FIELD OF THE INVENTION

The present invention relates to a crystal substrate of a group 13 nitride such as gallium nitride.

BACKGROUND OF THE INVENTION

In recent years, production of semiconductor devices such as blue LEDs, white LEDs, and violet semiconductor lasers by using group 13 nitrides such as gallium nitride and application of such semiconductor devices to various electronic apparatuses have been actively studied. Existing gallium nitride semiconductor devices are mainly produced by vapor-phase methods: specifically, by heteroepitaxial growth of a gallium nitride thin film on a sapphire substrate or a silicon carbide substrate by a metal-organic vapor phase epitaxy method (MOVPE) or the like. In this case, since such a substrate and the gallium nitride thin film are considerably different from each other in terms of thermal expansion coefficient and lattice constant, dislocations (one type of lattice defects in crystals) are generated at a high density in the gallium nitride. Accordingly, it is difficult to provide gallium nitride of high quality having a low dislocation density by vapor-phase methods. Other than vapor-phase methods, liquid-phase methods have also been developed. A flux method is one of such liquid-phase methods and, in the case of gallium nitride, allows a decrease in the temperature required for gallium nitride crystal growth to about 800° C. and a decrease in the pressure required for gallium nitride crystal growth to several megapascals by using sodium metal as a flux. Specifically, nitrogen gas dissolves in a melt mixture of sodium metal and gallium metal and the melt mixture is supersaturated with gallium nitride and a crystal of gallium nitride grows. Compared with vapor-phase methods, dislocations are less likely to be generated in such a liquid-phase method and hence gallium nitride of high quality having a low dislocation density can be obtained.

Studies on such flux methods have also been actively performed. For example, since existing flux methods have problems that a gallium nitride crystal grows in the thickness direction (C-axis direction) at a low growth rate of about 10 μm/h and non-uniform generation of nuclei tends to occur at the gas-liquid interface, Patent Literature 1 discloses a method for producing gallium nitride that overcomes the problems. Specifically, by stirring a melt mixture of sodium metal and gallium metal, a flow is generated from the gas-liquid interface at which the melt mixture and nitrogen gas are in contact with each other to the inside of the melt mixture. Patent Literature 1 states that, as a result, the growth rate of a gallium nitride crystal increased to 50 μm/h or more and non-uniform generation of nuclei did not occur at the gas-liquid interface or on the internal wall surface of a crucible.

PRIOR ART DOCUMENT

Patent Document

[Patent Document 1] Japanese Unexamined Patent Application Publication No. 2005-263622

However, when the growth rate of a gallium nitride crystal is made high as in Patent Literature 1, there are cases where the content of inclusions (solidified matter that is derived from the melt mixture incorporated into gallium nitride) increases and a gallium nitride crystal of high quality cannot be obtained.

SUMMARY OF THE INVENTION

An object of the present invention is to provide a group 13 nitride crystal substrate of high quality produced by growing a group 13 nitride crystal on a seed-crystal substrate by a flux method.

The inventors of the present invention rotated a vessel in which a seed-crystal substrate is immersed in a melt mixture containing gallium metal and sodium metal in an atmosphere containing pressurized nitrogen gas such that a gallium nitride crystal is grown on the seed-crystal substrate at a relatively low growth rate; subsequently added an organic solvent into the vessel to dissolve the flux in the organic solvent; and collected the gallium nitride crystal, which remained without being dissolved. As a result, the inventors have found that a gallium nitride crystal substrate of high quality having a low content of inclusions can be obtained. Thus, the inventors have accomplished the present invention.

A group 13 nitride crystal substrate according to the present invention is produced by growing a group 13 nitride crystal on a seed-crystal substrate with a melt containing a group 13 metal and a flux in the presence of a nitrogen-containing gas, wherein a content of inclusions in the group 13 nitride crystal grown in a region of the seed-crystal substrate except for a circumferential portion of the seed-crystal substrate, the region having an area fraction of 70% relative to an entire area of the seed-crystal substrate, is 10% or less, preferably 2% or less.

A group 13 nitride crystal substrate according to the present invention has a considerably lower content of inclusions than existing group 13 nitride crystal substrates and hence can be applied to technical fields that demand high quality, for example, to white LEDs that have high color-rendering properties and are expected to replace fluorescent lamps, violet laser discs for high-speed high-density optical storages, and power devices used for inverters for hybrid vehicles.

Examples of the group 13 nitride include boron nitride (BN), aluminum nitride (AlN), gallium nitride (GaN), indium nitride (InN), and thallium nitride (TlN). Of these, gallium nitride is preferred. The seed-crystal substrate may be, for example, a sapphire substrate, a silicon carbide substrate, or a silicon substrate on a surface of which a thin film of the group 13 nitride is formed; or a substrate of the group 13 nitride. The content of inclusions is the area fraction of a black portion of a binarized image obtained by binarizing a photograph of the polished surface of the substrate. The inclusions are solidified matter that is derived from the melt mixture incorporated into the group 13 nitride. For example, the inclusions at least contain the flux. The flux may be a metal melt at least containing sodium.

A group 13 nitride crystal substrate according to the present invention preferably has a dislocation density of $10^5/cm^2$ or less. Group 13 nitride crystal substrates produced by the flux method often have such a dislocation density of $10^5/cm^2$ or less.

When a group 13 nitride crystal substrate according to the present invention is a gallium nitride crystal substrate, the substrate emits blue fluorescence by irradiation with light from a mercury lamp. In general, gallium nitride crystals produced by flux methods emit blue fluorescence by irradiation with light from a mercury lamp. In contrast, gallium nitride crystals produced by vapor-phase methods emit yellow fluorescence by irradiation with such light. Accordingly, a crystal grown by a flux method and a crystal grown by a vapor-phase method can be distinguished from each other with respect to the color of fluorescence emitted from the crystal by irradiation with light from a mercury lamp.

BRIEF DESCRIPTION OF DRAWINGS

The patent or application file contains at least one drawing executed in color. Copies of this patent or patent application with color drawing(s) will be provided by the Office upon request and payment of the necessary fee.

Figure 1:
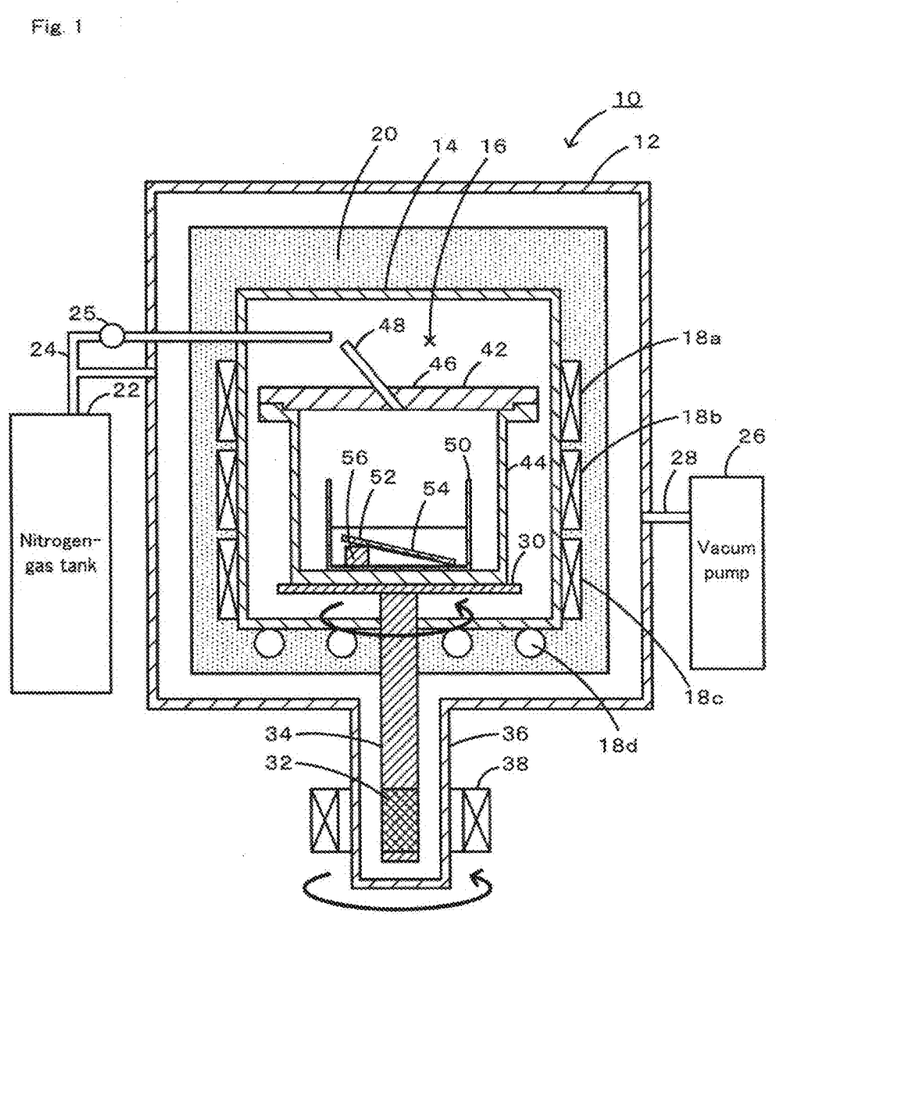
FIG. 1 is an explanatory view (sectional view) illustrating the entire configuration of a crystal substrate production apparatus 10.

Hereinafter, a preferred apparatus for producing a group 3B nitride crystal substrate according to the present invention will be described with reference to FIG. 1. FIG. 1 is an explanatory view (sectional view) illustrating the entire configuration of a crystal substrate production apparatus 10.

As illustrated in FIG. 1, a crystal substrate production apparatus 10 includes a pressure-resistant container 12 that can be evacuated and to which pressurized nitrogen gas can be fed; a turntable 30 rotatable within the pressure-resistant container 12; and an outer container 42 placed on the turntable 30.

The pressure-resistant container 12 has the shape of a cylinder with top and bottom surfaces having the shape of a disc; and contains a heating space 16 surrounded by a heater cover 14. The internal temperature of the heating space 16 can be adjusted with an upper heater 18a, a middle heater 18b, and a lower heater 18c that are arranged in the vertical direction along the lateral surface of the heater cover 14, and a bottom heater 18d disposed on the bottom surface of the heater cover 14. The heating space 16 has thermal insulating properties enhanced with a thermal insulating heater member 20 surrounding the heater cover 14. A nitrogen-gas feed pipe 24 from a nitrogen-gas tank 22 and an evacuation pipe 28 from a vacuum pump 26 are connected to the pressure-resistant container 12. The nitrogen-gas feed pipe 24 passes through the pressure-resistant container 12, the thermal insulating heater member 20, and the heater cover 14 into and so as to be in communication with the heating space 16. The nitrogen-gas feed pipe 24 branches off at an intermediate point therealong and is connected to and is in communication with a gap between the pressure-resistant container 12 and the thermal insulating heater member 20. The heater cover 14 is not completely airtight. To prevent a large pressure difference between the inside and outside of the heater cover 14, nitrogen gas is fed to the inside and outside of the heater cover 14. The branched pipe in the nitrogen-gas feed pipe 24 and in communication with the heating space 16 is equipped with a mass-flow controller 25 with which the flow rate can be controlled. The evacuation pipe 28 passes through the pressure-resistant container 12 into and so as to be in communication with a gap between the pressure-resistant container 12 and the thermal insulating heater member 20. When a vacuum is generated outside the heater cover 14, a vacuum is also generated in the heating space 16, which is in communication with the outside of the heater cover 14 through the nitrogen-gas feed pipe 24.

The turntable 30 is disc-shaped and disposed at a lower position within the heating space 16. A rotational shaft 34 including an internal magnet 32 is secured to the bottom surface of the turntable 30. The rotational shaft 34 extends through the heater cover 14 and the thermal insulating heater member 20 and is inserted into a cylindrical casing 36 integrated with the bottom surface of the pressure-resistant container 12. A cylindrical external magnet 38 is disposed around the casing 36 so as to be rotatable with a motor (not shown). The external magnet 38 and the internal magnet 32 in the rotational shaft 34 face each other with the casing 36 therebetween. Accordingly, as the external magnet 38 rotates, the rotational shaft 34 including the internal magnet 32 rotates and, as a result, the turntable 30 rotates. In addition, as the external magnet 38 moves upward or downward, the rotational shaft 34 including the internal magnet 32 moves upward or downward and, as a result, the turntable 30 moves upward or downward.

The outer container 42 has a metal outer-container body 44 having a cylindrical shape with a bottom and a metal outer-container lid 46 configured to seal an upper opening of the outer-container body 44. The outer-container lid 46 is equipped with a nitrogen introduction pipe 48 extending obliquely upward from the center of the bottom surface of the outer-container lid 46. The nitrogen introduction pipe 48 is designed such that, even when the outer container 42 rotates with the rotation of the turntable 30 and the nitrogen introduction pipe 48 reaches a position closest to the nitrogen-gas feed pipe 24, the nitrogen introduction pipe 48 does not collide with the nitrogen-gas feed pipe 24. Specifically, the distance between the nitrogen-gas feed pipe 24 and the nitrogen introduction pipe 48 that is at the position closest to the nitrogen-gas feed pipe 24 is designed to be several millimeters to several centimeters. A cylindrical growth vessel 50 made of alumina with a bottom is disposed within the outer-container body 44. A seed-crystal-substrate tray 52 that is disc-shaped and made of alumina is placed in the growth vessel 50. The seed-crystal-substrate tray 52 has, in its central portion, a recess into which a disc-shaped seed-crystal substrate 54 is fitted. An end of the seed-crystal-substrate tray 52 is placed on a tray support 56 and the other end of the seed-crystal-substrate tray 52 is in contact with the bottom surface of the growth vessel 50. The seed-crystal substrate 54 may be a sapphire substrate on a surface of which a thin film of the group 13 nitride is formed or a substrate of the group 13 nitride. The growth vessel 50 contains a group 13 metal and a flux. The flux may be appropriately selected from various metals in accordance with the group 13 metal. For example, when the group 13 metal is gallium, alkali metals are preferred, more preferably sodium metal and potassium metal, still more preferably sodium metal. The group 13 metal and the flux are heated to be turned into a melt mixture. In the present embodiment, the outer container 42 and the growth vessel 50 are disposed so as to be coaxial with the rotation central axis of the turntable 30. Accordingly, the melt mixture in the growth vessel 50 horizontally rotates during the rotation and does not considerably move in the vertical direction.

An example of using the crystal substrate production apparatus 10 having the above-described configuration according to the present embodiment will be described. The crystal substrate production apparatus 10 is used to produce a group 13 nitride by a flux method. Hereinafter, a case of producing a gallium nitride crystal substrate, which is a group 13 nitride crystal substrate, will be described as an example. In this case, a GaN template is prepared as the seed-crystal substrate 54; gallium metal is prepared as the group 13 metal; and sodium metal is prepared as the flux. The seed-crystal substrate 54 is immersed in a melt mixture containing gallium metal and sodium metal in the growth vessel 50. While the turntable 30 is rotated, the heating space 16 is heated with the heaters 18a to 18d and pressurized nitrogen gas is fed to the melt mixture. Thus, a gallium nitride crystal is grown on the seed-crystal substrate 54 in the melt mixture. When an appropriate amount of carbon is added to the melt mixture, generation of extraneous crystals is suppressed, which is preferable. The term "extraneous crystals" means gallium nitride crystals crystallized at positions outside the seed-crystal substrate 54. The gallium nitride crystal substrate grown in the melt mixture in the growth vessel 50 can be collected by, after cooling, adding an organic solvent (lower alcohol such as methanol or ethanol) to the vessel to dissolve unnecessary substances such as the flux in the organic solvent. The thus-obtained gallium nitride crystal substrate has the content of inclusions of 0 to 10% (0 to 2% depending on growth conditions). The inclusions are solidified matter of the melt mixture (melt of gallium metal and sodium metal) incorporated into the gallium nitride crystal. The content of inclusions is the area fraction of a black portion of a binarized image obtained by binarizing a photograph of the polished surface of the gallium nitride crystal substrate.

As described above, in the production of a gallium nitride crystal substrate, the heating temperature is preferably set at 700 to 1000° C., more preferably at 800 to 900° C. To make the temperature of the heating space 16 be uniform, it is preferred that the upper heater 18a, the middle heater 18b, the lower heater 18c, and the bottom heater 18d be set so as to have ascending temperatures in this order; or that the upper heater 18a and the middle heater 18b be set at a temperature T1 while the lower heater 18c and the bottom heater 18d be set at a temperature T2 higher than the temperature T1. The pressure of the pressurized nitrogen gas is preferably set at 1 to 7 MPa, more preferably 2 to 6 MPa. To adjust the pressure of the pressurized nitrogen gas, the vacuum pump 26 is driven to make the internal pressure of the pressure-resistant container 12 be a high vacuum (for example, 1 Pa or less or 0.1 Pa or less) through the evacuation pipe 28; the evacuation pipe 28 is then closed with a valve (not shown); and nitrogen gas is fed to the inside and outside of the heater cover 14 through the nitrogen-gas feed pipe 24 from the nitrogen-gas tank 22. While a gallium nitride crystal is grown, nitrogen gas is consumed as a result of dissolution thereof in the melt mixture and the pressure of the pressurized nitrogen gas decreases. Accordingly, nitrogen gas continues to be fed to the heating space 16 with the mass-flow controller 25 at a predetermined flow rate during crystal growth. At this time, the branched pipe in the nitrogen-gas feed pipe 24 and in communication with the outside of the heater cover 14 is closed with a valve (not shown).

The growth vessel 50 in which the seed-crystal substrate 54 is immersed in the melt mixture is rotated such that the growth rate of a gallium nitride crystal on the seed-crystal substrate 54 is 5 to 25 µm/h, preferably 10 to 25 µm/h. When the crystal growth rate is less than 5 µm/h, crystal growth time becomes excessively long and it becomes difficult to practically produce the crystal. When the crystal growth rate is more than 25 µm/h, the content of inclusions tends to increase, which is not preferable. The growth vessel 50 is preferably rotated in a single direction without being reversed; by repeating a reverse process constituted by rotation in a direction for a minute or more and then rotation in the reverse direction for a minute or more; or by repeating an intermittent process constituted by rotation in a direction for 5 seconds or more, subsequently a pause for 0.1 seconds or more, and then rotation in the same direction for 5 seconds or more. As for these processes, when the reverse process is repeated with a period shorter than a minute or the intermittent process is repeated with a period shorter than 5 seconds, the crystal growth rate becomes too high and the content of inclusions increases, which is not preferable. When the melt mixture is excessively mixed in the depth direction (vertical direction), the crystal growth rate becomes too high and the content of inclusions increases, which is not preferable. The growth time of a gallium nitride crystal may be appropriately set in accordance with heating temperature or the pressure of pressurized nitrogen gas, for example, in the range of several hours to several hundred hours.

As has been described so far in detail, a group 13 nitride crystal having an inclusion content of 10% or less, preferably 2% or less, can be provided with the crystal substrate production apparatus 10 according to the present embodiment by relatively slowly rotating the growth vessel 50 containing a melt mixture in the sealed pressure-resistant container 12 into which nitrogen gas is introduced at a high temperature. Accordingly, the group 13 nitride crystal can be applied to various technical fields that demand group 13 nitride crystals of high quality, for example, to white LEDs that have high color-rendering properties and are expected to replace fluorescent lamps, violet laser discs for high-speed high-density optical storages, and power devices used for inverters for hybrid vehicles.

In addition, since the seed-crystal-substrate tray 52 in the center of which the seed-crystal substrate 54 is fitted is used and an end of the seed-crystal-substrate tray 52 is placed on the tray support 56 such that the seed-crystal-substrate tray 52 is inclined in the growth vessel 50, crystal growth tends to sufficiently proceed on the entire surface of the seed-crystal substrate 54. Since a melt mixture tends to stagnate in the circumferential region on the bottom surface of the growth vessel 50, when a portion of the seed-crystal substrate 54 is positioned near the region, crystal growth in the portion is less likely to sufficiently proceed. However, in the present embodiment, since the seed-crystal-substrate tray 52 is used, the seed-crystal substrate 54 is not positioned near the circumferential region on the bottom surface of the growth vessel 50 and crystal growth tends to sufficiently proceed on the entire surface of the seed-crystal substrate 54.

In addition, since the nitrogen-gas feed pipe 24 is separated from the nitrogen introduction pipe 48, the feed pipe 24 and the pipe 48 do not hamper rotation of the outer container 42 together with the turntable 30.

In addition, since the upper, middle, and lower heaters 18a to 18c and the bottom heater 18d are disposed, the entirety of the heating space 16 including a portion near the bottom in which uniform temperature is less likely to be achieved can be uniformly maintained at a temperature.

In addition, since the rotational shaft 34 integrated with the internal magnet 32 is configured to rotate or move upward or downward in accordance with rotation or movement upward or downward of the external magnet 38 disposed around the casing 36, the outer container 42 can be rotated or moved upward or downward while the interior of the pressure-resistant container 12 is kept sealed.

EXAMPLES

Example 1

A gallium nitride crystal substrate was produced with the crystal substrate production apparatus 10 illustrated in FIG. 1. Hereinafter, the production procedures will be described. The tray support 56 was placed in a marginal portion within the growth vessel 50 having an internal diameter of 100 mm within a glove box having an argon atmosphere. The seed-crystal-substrate tray 52 was placed so as to lean on the tray support 56, at an angle of 10° in the center of the bottom surface of the growth vessel 50. A GaN template having a diameter of 3 inches was placed as the seed-crystal substrate 54 in the center of the seed-crystal-substrate tray 52. Furthermore, 110 g of sodium metal, 130 g of gallium metal, and 300 mg of carbon were added into the growth vessel 50. The growth vessel 50 was put into the outer-container body 44. The opening of the outer-container body 44 was closed with the outer-container lid 46 equipped with the nitrogen introduction pipe 48. The outer container 42 was placed on the turntable 30 that had been baked in vacuum. The pressure-resistant container 12 was sealed with a lid (not shown).

The pressure-resistant container 12 was evacuated to 0.1 Pa or less by driving the vacuum pump 26. Subsequently, while the upper heater 18a, the middle heater 18b, the lower heater 18c, and the bottom heater 18d were respectively set at 855° C., 855° C., 880° C., and 880° C. to heat the heating space 16 to 870° C., nitrogen gas was introduced from the nitrogen-gas tank 22 to reach 4.5 MPa and the outer container 42 was rotated about the central axis at 30 rpm. This state was maintained for 150 hours. Subsequently, the temperature was allowed to decrease naturally to room temperature. The lid of the pressure-resistant container 12 was then opened and the growth vessel 50 was taken out. Ethanol was added into the growth vessel 50 to dissolve sodium metal in ethanol. The gallium nitride crystal substrate grown was then collected. The gallium nitride crystal substrate had a diameter of 3 inches and a thickness of about 1.5 mm. The crystal growth rate was about 10 μm/h. The gallium nitride crystal substrate was polished so as to have a thickness of 500 μm. A photograph of the gallium nitride crystal substrate was binarized. The area of inclusions (area of black portions in the binarized image) within a region of the seed-crystal substrate 54 except for the circumferential portion of the seed-crystal substrate 54, the region corresponding to 70% of the seed-crystal substrate 54, was determined. The area fraction of inclusions relative to the entirety of the 70% region, that is, the inclusion content was calculated.

Figure 2:
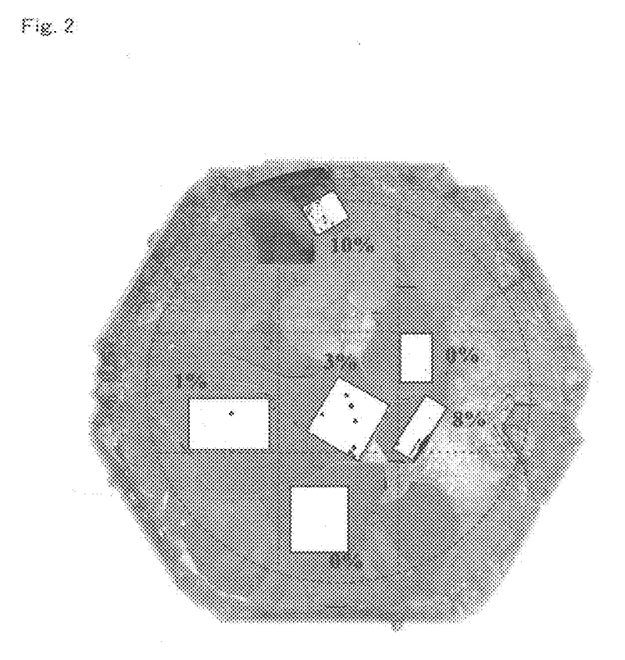
FIG. 2 is a photograph of a gallium nitride crystal substrate obtained in EXAMPLE 1.

Hereinafter, a method for calculating the inclusion content will be specifically described with reference to FIG. 2. FIG. 2 is a photograph of the gallium nitride crystal substrate in EXAMPLE 1. This photograph is a composite photograph in which pieces having broken after polishing of the obtained gallium nitride crystal substrate are brought back to their original positions on the photograph of the gallium nitride crystal substrate prior to the polishing. The circle represented by a dotted line in the photograph indicates the boundary of the 70% region of the seed-crystal substrate except for the circumferential portion of the seed-crystal substrate. The region is divided into nine segments with two lines extending in the longitudinal direction and two lines extending in the transverse direction. The inclusion content is described with values in terms of five segments among the nine segments: the upper segment, the middle segment, the lower segment, the left segment, and the right segment. As is clear from FIG. 2, the inclusion content was 0 to 10%. Irradiation with light from a mercury lamp resulted in emission of blue fluorescence. The dislocation density was $3 \times 10^4/cm^2$. The dislocation density was determined by the following procedures. The surface (Ga surface) of the gallium nitride crystal was polished using diamond slurry and etched by immersion into an acidic solution (a mixed solution of sulfuric acid:phosphoric acid=1:3 (volume ratio)) at 250° C. for about 2 hours. A differential interference image was then observed with an optical microscope to determine the number of etch pits derived from dislocations per unit area by visual inspection.

Example 2

A gallium nitride crystal was grown under the same conditions as those in EXAMPLE 1 except that the outer container 42 was rotated at 1 rpm. The obtained gallium nitride crystal substrate had a diameter of 3 inches and a thickness of about 750 μm. The crystal growth rate was about 5 μm/h. The gallium nitride crystal substrate was also measured in terms of the inclusion content of the five segments as in EXAMPLE 1 and the inclusion content was found to be 0 to 10%. Irradiation with light from a mercury lamp resulted in emission of blue fluorescence. The dislocation density was $1 \times 10^4/cm^2$.

Example 3

A gallium nitride crystal was grown under the same conditions as those in EXAMPLE 1 except that the outer container 42 was rotated at 5 rpm. The obtained gallium nitride crystal substrate had a diameter of 3 inches and a thickness of about 1 mm. The crystal growth rate was about 7 μm/h. The gallium nitride crystal substrate was also measured in terms of the inclusion content of the five segments as in EXAMPLE 1 and the inclusion content was found to be 0 to 1%. Irradiation with light from a mercury lamp resulted in emission of blue fluorescence. The dislocation density was $2 \times 10^4/cm^2$.

Example 4

Figure 3:
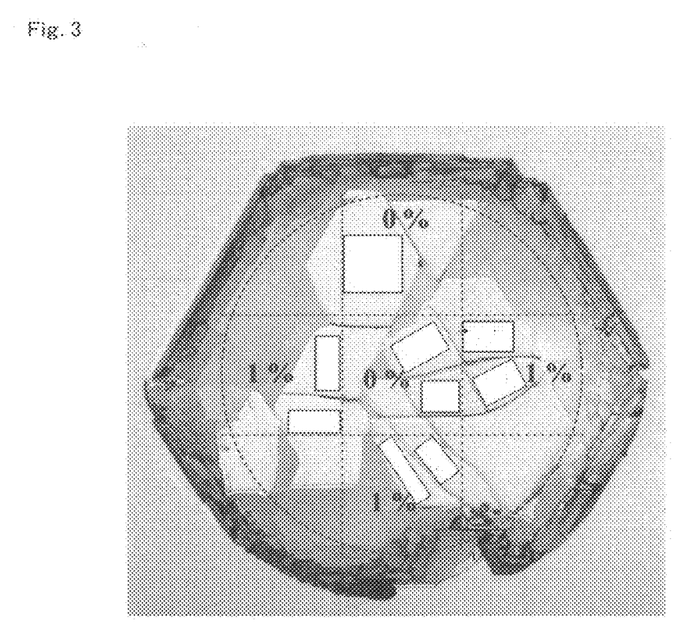
FIG. 3 is a photograph of a gallium nitride crystal substrate obtained in EXAMPLE 4.

A gallium nitride crystal was grown under the same conditions as those in EXAMPLE 1 except that the seed-crystal-substrate tray 52 was not used and the seed-crystal substrate 54 was placed directly on the tray support 56; a GaN template having a diameter of 2 inches was used as the seed-crystal substrate 54; an alumina vessel having an inner diameter of 70 mm was used as the growth vessel 50; 60 g of sodium metal, 40 g of gallium metal, and 150 mg of carbon were added into the growth vessel 50; and the outer container 42 was rotated at 15 rpm. The obtained gallium nitride crystal substrate had a diameter of 2 inches and a thickness of about 1.5 mm. The crystal growth rate was about 10 μm/h. FIG. 3 is a photograph of a gallium nitride crystal substrate obtained in EXAMPLE 4. The gallium nitride crystal substrate was also measured in terms of the inclusion content of the five segments as in EXAMPLE 1 and the inclusion content was found to be 0 to 1%. Irradiation with light from a mercury lamp resulted in emission of blue fluorescence.

Example 5

A gallium nitride crystal was grown under the same conditions as those in EXAMPLE 4 except that the outer container 42 was rotated at 60 rpm. The obtained gallium nitride crystal substrate had a diameter of 2 inches and a thickness of about 1.5 mm. The crystal growth rate was about 10 μm/h. The gallium nitride crystal substrate was also measured in terms of the inclusion content of the five segments as in EXAMPLE 1 and the inclusion content was found to be 0 to 5%. Irradiation with light from a mercury lamp resulted in emission of blue fluorescence.

Example 6

A gallium nitride crystal was grown under the same conditions as those in EXAMPLE 4 except that the outer container 42 was rotated at 100 rpm. The obtained gallium nitride crystal substrate had a diameter of 2 inches and a thickness of about 1.5 mm. The crystal growth rate was about 10 μm/h. The gallium nitride crystal substrate was also measured in terms of the inclusion content of the five segments as in EXAMPLE 1 and the inclusion content was found to be 0 to 10%. Irradiation with light from a mercury lamp resulted in emission of blue fluorescence.

Example 7

Figure 4:
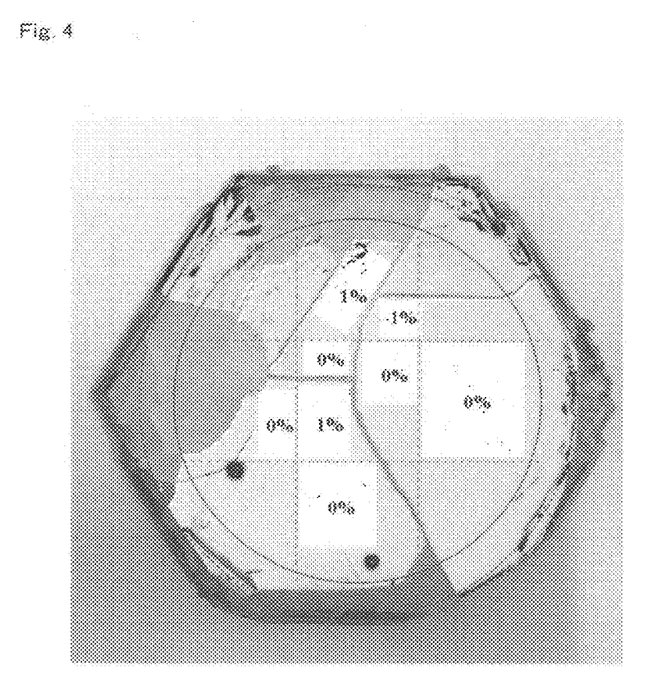
FIG. 4 is a photograph of a gallium nitride crystal substrate obtained in EXAMPLE 7.

A gallium nitride crystal was grown under the same conditions as those in EXAMPLE 4 except that the outer container 42 was rotated at 30 rpm and the rotation was reversed every 5 minutes. The obtained gallium nitride crystal substrate had a diameter of 2 inches and a thickness of about 2 mm. The crystal growth rate was about 13 μm/h. FIG. 4 is a photograph of a gallium nitride crystal substrate obtained in EXAMPLE 7. The gallium nitride crystal substrate was also measured in terms of the inclusion content of the five segments as in EXAMPLE 1 and the inclusion content was found to be 0 to 1%. Irradiation with light from a mercury lamp resulted in emission of blue fluorescence. The dislocation density was $5 \times 10^4/cm^2$.

Example 8

A gallium nitride crystal was grown under the same conditions as those in EXAMPLE 7 except that the outer container 42 was rotated at 30 rpm and the rotation was reversed every 3 minutes. The obtained gallium nitride crystal substrate had a diameter of 2 inches and a thickness of about 2.5 mm. The crystal growth rate was about 17 μm/h. The gallium nitride crystal substrate was also measured in terms of the inclusion content of the five segments as in EXAMPLE 1 and the inclusion content was found to be 0 to 1%. Irradiation with light from a mercury lamp resulted in emission of blue fluorescence.

Example 9

A gallium nitride crystal was grown under the same conditions as those in EXAMPLE 7 except that the outer container 42 was rotated at 30 rpm and the rotation was reversed every 1 minute. The obtained gallium nitride crystal substrate had a diameter of 2 inches and a thickness of about 3.8 mm. The crystal growth rate was about 25 μm/h. The gallium nitride crystal substrate was also measured in terms of the inclusion content of the five segments as in EXAMPLE 1 and the inclusion content was found to be 0 to 10%. Irradiation with light from a mercury lamp resulted in emission of blue fluorescence.

Example 10

A gallium nitride crystal was grown under the same conditions as those in EXAMPLE 7 except that the outer container 42 was subjected to a repeated intermittent process constituted by rotation at 30 rpm in a direction for 5 seconds, subsequently a pause for 1 second, and then rotation at 30 rpm in the same direction for 5 seconds. The obtained gallium nitride crystal substrate had a diameter of 2 inches and a thickness of about 3 mm. The crystal growth rate was about 20 μm/h. The gallium nitride crystal substrate was also measured in terms of the inclusion content of the five segments as in EXAMPLE 1 and the inclusion content was found to be 0 to 5%. Irradiation with light from a mercury lamp resulted in emission of blue fluorescence.

Comparative Example 1

Figure 5:
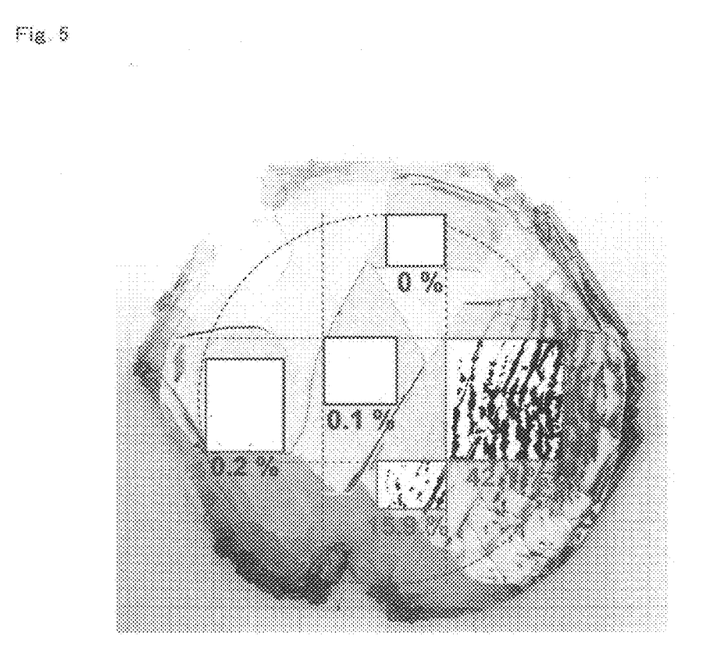
FIG. 5 is a photograph of a gallium nitride crystal substrate obtained in COMPARATIVE EXAMPLE 1.

A gallium nitride crystal was grown under the same conditions as those in EXAMPLE 4 except that the outer container 42 was not rotated. The obtained gallium nitride crystal substrate had a diameter of 2 inches and a thickness of about 1.5 mm. The crystal growth rate was about 10 μm/h and partially brown-tinted. FIG. 5 is a photograph of a gallium nitride crystal substrate obtained in COMPARATIVE EXAMPLE 1. The gallium nitride crystal substrate was also measured in terms of the inclusion content of the five segments as in EXAMPLE 1 and the inclusion content was found to be 0 to 42%. The dislocation density was $5 \times 10^4/cm^2$.

Comparative Example 2

Figure 6:
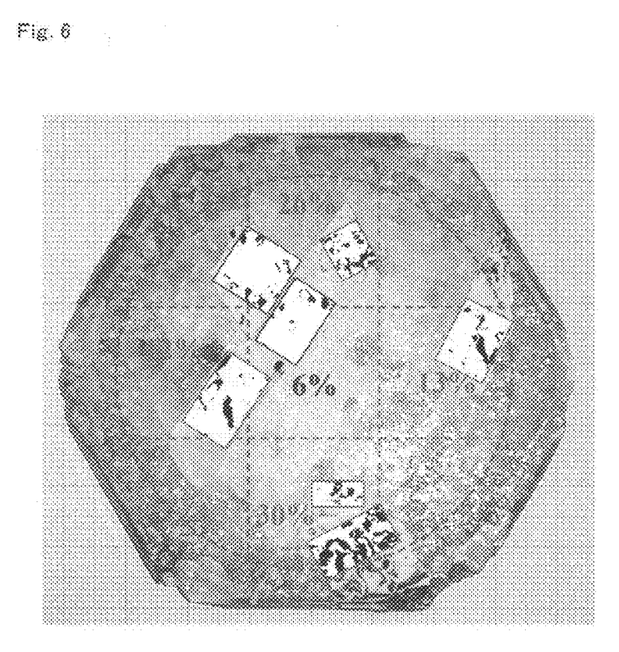
FIG. 6 is a photograph of a gallium nitride crystal substrate obtained in COMPARATIVE EXAMPLE 2.

A gallium nitride crystal was grown under the same conditions as those in EXAMPLE 1 except that the outer container 42 was rotated at 30 rpm and the rotation was reversed every 15 seconds; and the crystal growth time was 100 hours. The obtained gallium nitride crystal substrate had a diameter of 3 inches and a thickness of about 3 mm. The crystal growth rate was about 30 μm/h. FIG. 6 is a photograph of a gallium nitride crystal substrate obtained in COMPARATIVE EXAMPLE 2. The gallium nitride crystal substrate was also measured in terms of the inclusion content of the five segments as in EXAMPLE 1 and the inclusion content was found to be 6 to 30%. The dislocation density was $1 \times 10^5/cm^2$.

Comparative Example 3

A gallium nitride crystal was grown under the same conditions as those in EXAMPLE 10 except that the outer container 42 was subjected to a repeated intermittent process constituted by rotation at 30 rpm in a direction for 3 seconds, subsequently a pause for 1 second, and then rotation at 30 rpm in the same direction for 3 seconds; and the crystal growth time was 100 hours. The obtained gallium nitride crystal substrate had a diameter of 2 inches and a thickness of about 3 mm. The crystal growth rate was about 30 μm/h. The gallium nitride crystal substrate was also measured in terms of the inclusion content of the five segments as in EXAMPLE 1 and the inclusion content was found to be 0 to 20%. Irradiation with light from a mercury lamp resulted in emission of blue fluorescence. The dislocation density was $1 \times 10^5 / cm^2$.

The crystal growth conditions and results of EXAMPLES 1 to 10 and COMPARATIVE EXAMPLES 1 to 3 are described in Table 1. As is clear from Table 1, the inclusion content was suppressed to 10% or less in EXAMPLES 1 to 10 (with rotation), compared with COMPARATIVE EXAMPLE 1 (without rotation). The inclusion content was high in COMPARATIVE EXAMPLE 2 (at 30 rpm and reversed every 15 seconds) in spite of rotation. This was probably caused because the melt mixture was excessively mixed in the depth direction (vertical direction) and the crystal growth rate became too high. In contrast, the inclusion content was low in EXAMPLES 7 to 9 (at 30 rpm and reversed every 5 to 1 minute) probably because the rotation was reversed but the period was long and hence the crystal growth rate became relatively low. The inclusion content was high in COMPARATIVE EXAMPLE 3 (at 30 rpm and intermittently operated for 3 seconds) in spite of rotation. This was probably caused because the melt mixture was excessively mixed in the depth direction (vertical direction) and the crystal growth rate became too high. In contrast, the inclusion content was low in EXAMPLE 10 (intermittently operated for 5 seconds) probably because the intermittent period was long and hence the crystal growth rate became relatively low.

TABLE 1

| | Size of seed-crystal substrate (inch) | Rotation Rate (rpm) | Rotation Method | Crystal growth rate (μm/h) | Content of inclusion (%) | Dislocation density (Number of etch pit/cm²) |
|---|---|---|---|---|---|---|
| EXAMPLE 1 | φ3 | 30 | No reverse | 10 | 0~10 | $3 \times 10^4$ |
| EXAMPLE 2 | φ3 | 1 | No reverse | 5 | 0~10 | $1 \times 10^4$ |
| EXAMPLE 3 | φ3 | 5 | No reverse | 7 | 0~1 | $2 \times 10^4$ |
| EXAMPLE 4 | φ2 | 15 | No reverse | 10 | 0~1 | (Not measured) |
| EXAMPLE 5 | φ2 | 60 | No reverse | 10 | 0~5 | (Not measured) |
| EXAMPLE 6 | φ2 | 100 | No reverse | 10 | 0~10 | (Not measured) |
| EXAMPLE 7 | φ2 | 30 | Reverse every 5 minutes | 13 | 0~1 | $5 \times 10^4$ |
| EXAMPLE 8 | φ2 | 30 | Reverse every 3 minutes | 17 | 0~1 | (Not measured) |
| EXAMPLE 9 | φ2 | 30 | Reverse every 1 minute | 25 | 0~10 | (Not measured) |
| EXAMPLE 10 | φ2 | 30 | Pause for 1 second every 5 minutes | 20 | 0~5 | (Not measured) |
| COMPARATIVE EXAMPLE 1 | φ2 | — | No rotation | 10 | 0~42 | $5 \times 10^4$ |
| COMPARATIVE EXAMPLE 2 | φ3 | 30 | Reverse every 15 seconds | 30 | 6~30 | $1 \times 10^5$ |
| COMPARATIVE EXAMPLE 3 | φ2 | 30 | Pause for 1 second every 3 seconds | 30 | 0~20 | $1 \times 10^5$ |

The present application claims the benefit of the priority from Japanese Patent Application No. 2009-011264 filed on Jan. 21, 2009, and Japanese Patent Application No. 2009-017289 filed on Jan. 28, 2009, the entire contents of which are incorporated herein by reference.

INDUSTRIAL APPLICABILITY

The present invention is applicable to high-frequency devices represented by power amplifiers and semiconductor devices such as blue LEDs, white LEDs, and violet semiconductor lasers.

The invention claimed is:
1. A group 13 nitride crystal substrate produced by growing a group 13 nitride crystal on a seed-crystal substrate in a melt containing a group 13 metal and an Na flux in the presence of a nitrogen-containing gas,
   wherein a content of inclusions in the group 13 nitride crystal grown in a region of the seed-crystal substrate except for a circumferential portion of the seed-crystal substrate, the region having an area fraction of 70% relative to an entire the seed-crystal substrate, is 5% or less,
   wherein the inclusions at least contain the flux,
   wherein the content of inclusions is an area fraction of a black portion of a binarized image obtained by binarizing a photograph of a polished surface of the substrate,
   the group 13 nitride crystal substrate having as dislocation density of $10^5/cm^2$ or less, and the content of inclusions is 1% or less.

2. The group 13 nitride crystal substrate according to claim 1, wherein the group 13 nitride is gallium nitride.

3. The group 13 nitride crystal substrate according to claim 1, wherein the group 13 nitride crystal substrate emits blue fluorescence by irradiation with light from a mercury lamp.

\* \* \* \* \*